Dec. 6, 1966 F. D. ROSI ET AL 3,290,186
SUPERCONDUCTING MATERIALS AND METHOD OF MAKING THEM
Filed May 20, 1963
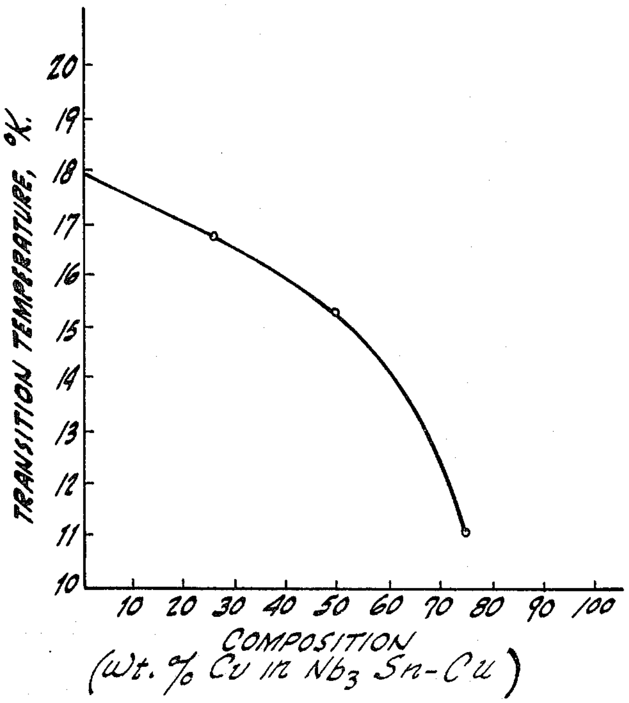
INVENTORS
FRED D. ROSI &
JOSEPH J. HANAK
BY Morris L. Rabkin
Attorney 3,290,186

SUPERCONDUCTING MATERIALS AND METHOD OF MAKING THEM

Fred D. Rosi, Princeton, and Joseph J. Hanak, Trenton, N.J., assignors to Radio Corporation of America, a corporation of Delaware Filed May 20, 1963, Ser. No. 281,560
13 Claims. (Cl. 148—126)

This invention relates generally to superconducting materials and methods of making them. More particularly, the invention relates to novel superconducting materials and to novel methods of making bodies of these superconducting materials that have selected transition temperatures within a relatively wide range of temperatures.

By the term "transition temperature," as used herein, is meant the temperature at which the resistance of a superconducting material decreases sharply, that is, the temperature at which the material becomes superconducting.

In the field of cryogenic research, it is often necessary to employ superconducting materials that have desired transition temperatures. It has been a common practice to employ known, substantially pure, superconducting materials with specific transition temperatures for this purpose. The transition temperatures of these superconducting materials can be shifted by subjecting the materials to a magnetic field or by passing current through them.

It is an object of the present invention to provide an improved method of making superconducting materials whose transition temperatures may be selected within a relatively wide range of temperatures, depending upon the relative quantities of components in the superconducting materials.

Another object of the present invention is to provide improved superconducting materials that have relatively high transition temperatures and that are relatively stronger, that is, less brittle, than some of the prior art superconducting materials which come within the same range of transition temperatures.

Still another object of the present invention is to provide a novel method of changing the transition temperature of a superconducting material.

A further object of the present invention is to provide an improved method of making superconducting materials of the type described in the form of rods, sheets and ribbons that are useful in cryogenic devices, such as switches and solenoids.

In accordance with the present invention, each of the improved superconducting materials comprises a compacted, two-phase mixture of the powders of two components, at least one of which is a superconductor, that is, a superconducting metal, and the other of which is a relatively soft, malleable metal. The transition temperature of the compacted mixture is a function of the quantity and material of the component added to the superconductor. The superconducting material may comprise, for example, a compacted mixture of a superconducting mateal, for example, niobium tin ($Nb_3Sn$) and copper (Cu) in proportions varying, for example, from 2 weight percent of Cu and 98 weight percent of $Nb_3Sn$ to 75 weight percent of Cu and 25 weight percent of $Nb_3Sn$. In carrying out the improved method of the present invention, powders of a superconducting metal and another metal, the latter of which may also be a superconductor, are mixed thoroughly. The mixture of powders is then compacted into a desired shape, as by the use of suitable dies, with sufficient pressure to form a solid body. The strength of the compacted mixture may be increased by annealing it in vacuo. The step of mixing powders of the two components may be carried out by evaporating one of the components onto a powder of the other, as, for example, evaporating lead (Pb) onto a powder of $Nb_3Sn$. In accordance with foregoing, it is possible to provide bodies of superconducting materials the transition temperatures of which may be selected within a relatively wide range of temperatures, depending upon the relative proportions of the metals in the bodies.

The novel features of the present invention, both as to its composition and method of manufacture, as well as additional objects and advantages thereof, will be more readily understood when read in connection with the accompanying drawing, the single figure of which is a graph indicating the variations in the transition temperature of a compacted mixture of $Nb_3Sn$ and Cu when the proportions of components in the mixture are varied.

*Example No. 1*

To manufacture a solid body of superconducting material comprising $Nb_3Sn$ and Cu, sintered $Nb_3Sn$ is ground into a powder until the particles of the powder are small enough to pass through a 260 mesh screen or smaller. The Cu is also ground until its particles are small enough to pass through the 260 mesh screen or smaller. The powders are mixed thoroughly to form a homogenous mixture, and the mixed powders are then compacted into a desired shape by pressing them in dies with a pressure of approximately 8,000 p.s.i. The proportion of Cu to $Nb_3Sn$ may vary about 2 weight percent Cu and 98 weight percent $Nb_3Sn$ to about 75 weight percent Cu and 25 weight percent $Nb_3Sn$. If desired, the resulting bodies of compacted mixtures may be annealed at a temperature of about 700° C. for about two hours in vacuo. If so annealed, the bodies will withstand comparatively rough mechanical usage. The following transition temperatures in bodies of compacted mixtures of powdered $Nb_3Sn$ and Cu were found, as shown in the drawing, for indicated weight precents of Cu:

| Weight percent Cu: | Transition temperature (° K.) |
|---|---|
| 25 | 16.7 |
| 50 | 15.3 |
| 75 | 11 |

The annealed bodies of compacted $Nb_3Sn$ and Cu mixtures may also be rolled into thin sheets, if so desired.

X-ray diffraction studies on bodies of compacted mixtures of powders of $Nb_3Sn$ and Cu indicated that two phases were present in the bodies, namely, the solid phases of $Nb_3Sn$ and Cu.

*Example No. 2*

When a superconducting material is to be utilized primarily in the form of sheets or in thin ribbons, a superconducting material comprising a body of a compacted mixture of $Nb_3Sn$ and Pb was found to be very satisfactory. In manufacturing the compacted mixture of $Nb_3Sn$ and Pb, sintered $Nb_3Sn$ is ground into a fine powder capable of passing through a 260 mesh screen or finer. Pb is then evaporated at a temperature of between 1,000 and 1,100° C. onto the $Nb_3Sn$ powder in vacuo and mixed further, if necessary, to form a thorough mixture. The proportion of Pb to $Nb_3Sn$ may vary from about 2 weight percent Pb and 98 weignt percent $Nb_3Sn$ to about 75 weight percent Pb and 25 weight percent $Nb_3Sn$. The resulting mixture is then compacted under a pressure of about 8,000 p.s.i. by means of suitable dies to form a body of desired shape. The resulting body may now be rolled into sheets as thin as 0.003 inch, if so desired. This could not be accomplished with $Nb_3Sn$ alone.

Though superconductors with relatively high transition temperatures, such as $Nb_3Sn$ and $V_3Si$, for example, are relatively brittle in their pure state, they acquire added strength when compacted with a relatively soft, malleable metal, such as Cu or Pb. Therefore, in achieving a selected transition temperature in a body having a relatively brittle superconducting metal and another metal softer and more malleable than the superconducting metal, the mechanical strength of the body is improved over that of a body of the superconducting metal alone.

Since it is possible to select the transition temperature of superconducting materials that comprise bodies of compacted mixtures of powders of a superconductor and a metal, the latter of which may or may not be a superconductor, a series of superconducting materials, each having a different, and desired, transition temperature, can be manufactured by the methods of the present invention. Thus, cryogenic switches, useful in the data processing field, and solenoids, for example, may be made with any desired, specific transition temperature, and superconductors in their pure states need no longer be relied upon, thereby obviating the necessity of providing magnetic and current means to alter the transition temperature of a "pure" superconductor to a desired value.

From the foregoing description, it will be apparent that there have been provided improved superconducting bodies and methods of making them so as to possess transition temperatures of desired values within a relatively wide range of transition temperatures. Variations in composition and methods of making these materials, all coming within the spirit of this invention, will, no doubt, readily suggest themselves to those skilled in the art. Hence, it is desired that the foregoing shall be considered as illustrative and not in a limiting sense.

What is claimed is:

1. A body of superconducting material comprising a compacted mixture of $Nb_3Sn$ powder and Cu powder.

2. A body of superconducting material comprising a compacted mixture of $Nb_3Sn$ powder and Cu powder, said compacted mixture being annealed.

3. A body of superconducting material comprising a compacted mixture of $Nb_3Sn$ powder and Pb powder.

4. A body of superconducting material comprising a compacted two-phase mixture of powders of a superconducting substance and a metal, said powders being of about 260 mesh, said metal being relatively more malleable than said superconducting substance, and said compacted mixture being more malleable than said superconducting substance alone and having a transition temperature which varies with the amount of said metal in said mixture.

5. A body of superconducting material comprising a compacted mixture of powders of $V_3Si$ and a metal from the group consisting of Cu and Pb.

6. A body of superconducting material comprising a compacted mixture of powders of $V_3Si$ and a metal from the group consisting of Cu and Pb, said compacted mixture being annealed.

7. An article of manufacture comprising a body of superconducting material, said material being a two-phase compacted mixture of powders of Cu and $Nb_3Sn$ in the proportions within the range from about 2 weight percent of Cu and 98 weight percent of $Nb_3Sn$ to about 75 weight percent of Cu and 25 weight percent of $Nb_3Sn$.

8. A body of superconducting two-phase material whose transition temperature is a function of the weight percent of a metal in said material, said material comprising a compacted mixture of powders of $Nb_3Sn$ and said metal, the ratio of said metal to $Nb_3Sn$ being from 2 weight percent of said metal and 98 weight percent of $Nb_3Sn$ to 75 weight percent of said metal and 25 weight percent of $Nb_3Sn$, said metal being one selected from the group consisting of Cu and Pb.

9. A method of making a body of malleable superconducting material whose transition temperature is within a range of temperatures depending upon the weight percent of a malleable metal and the weight percent of a relatively brittle superconductor in said body, said method comprising the steps of (a) mixing a powder of said superconductor with a powder of said metal to provide a two-phase mixture thereof, said powders being of at least 260 mesh, (b) compacting said mixture of said powders with a pressure of about 8,000 p.s.i. to form a substantially solid body, and (c) annealing said solid body at a temperature below the melting point of said superconductor, whereby to maintain said two-phase mixture.

10. A method of making a body of superconducting material comprising a compacted mixture of $Nb_3Sn$ and Cu powders whose transition temperature is within a range of temperatures depending upon the weight percent of Cu and the weight percent of $Nb_3Sn$ in said body, said method comprising (a) mixing a powder of $Nb_3Sn$ of about 260 mesh with a power of Cu of about 260 mesh to provide a mixture thereof, the proportion of Cu to $Nb_3Sn$ being in the range from 2 weight percent of Cu and 98 weight percent of $Nb_3Sn$ to 75 weight percent of Cu and 25 weight percent of $Nb_3Sn$, (b) compacting said mixture of powders with a pressure of about 8,000 p.s.i. to form a substantially solid body, and (c) annealing said solid body at about 700° C. for 2 hours in vacuo.

11. A method of making a body of malleable superconducting material comprising a relatively brittle superconducting substance and a malleable metal, said method comprising the steps of (a) evaporating said metal in vacuo onto a powder of said superconducting substance of about 260 mesh and mixing said evaporated metal and said superconducting substance to form a two-phase mixture, and (b) compacting the mixture of said evaporated metal and said superconducting substance powder with a pressure of about 8,000 p.s.i. into a solid body.

12. A method of making a body of superconducting material comprising $Nb_3Sn$ and Pb, said method comprising the steps of (a) evaporating Pb at a temperature of from 1,000 to 1,100° C. in vacuo onto a powder of $Nb_3Sn$ and forming a mixture of evaporated Pb and said $Nb_3Sn$ powder, and (b) compacting said mixture of evaporated Pb and $Nb_3Sn$ powder into a solid body.

13. A method of making a body of superconducting material comprising $Nb_3Sn$ and Pb, said method comprising the steps of (a) evaporating Pb at a temperature of from 1,000 to 1,100° C. in vacuo onto a powder of $Nb_3Sn$ and forming a mixture of said Pb and $Nb_3Sn$, (b) compacting said mixture of evaporated Pb and $Nb_3Sn$ powder to form a solid body, and (c) working said body into a desired form, the ratio of Pb to $Nb_3Sn$ being in the range from about 2 weight percent of Pb and 98 weight percent of $Nb_3Sn$ to about 75 weight percent of Pb and 25 weight percent of $Nb_3Sn$.

References Cited by the Examiner

UNITED STATES PATENTS

| | | | |
|---|---|---|---|
| 3,084,041 | 4/1963 | Zegler et al. | 75—175 X |
| 3,162,943 | 12/1964 | Wong | 29—552.2 |
| 3,181,936 | 5/1965 | Denny et al. | 29—192 |

OTHER REFERENCES

Niobium, Tantalum, Molybdenum and Tungsten, Elsevier Pub. Co., N.Y., 1961, pages 140 and 141 relied on.

Superconductors, Interscience Publishers N.Y., 1962, pages 46–50 and 143–149 relied on.

DAVID L. RECK, *Primary Examiner.*

C. N. LOVELL, *Assistant Examiner.*